(12) United States Patent
Leng et al.

(10) Patent No.: US 7,939,743 B2
(45) Date of Patent: May 10, 2011

(54) COMPUTER WITH THERMOELECTRIC CONVERSION

(75) Inventors: Yao-Shih Leng, Taipei (TW); Heng-Yung Su, Taipei County (TW)

(73) Assignee: Micro-Star International Co., Ltd., Taipei County (TW)

( * ) Notice: Subject to any disclaimer, the term of this patent is extended or adjusted under 35 U.S.C. 154(b) by 823 days.

(21) Appl. No.: 11/162,535

(22) Filed: Sep. 14, 2005

(65) Prior Publication Data

US 2007/0056622 A1    Mar. 15, 2007

(51) Int. Cl.
*H01L 35/30* (2006.01)
(52) U.S. Cl. .................................. 136/205; 136/224
(58) Field of Classification Search .................. 136/205, 136/224
See application file for complete search history.

(56) References Cited

U.S. PATENT DOCUMENTS

| | | | | |
|---|---|---|---|---|
| 3,801,824 A | * | 4/1974 | Eastwood et al. | 369/99 |
| 5,419,780 A | * | 5/1995 | Suski | 136/205 |
| 6,143,975 A | * | 11/2000 | Liao et al. | 136/201 |
| 6,741,465 B2 | * | 5/2004 | Holalkere et al. | 361/679.46 |
| 6,799,282 B2 | | 9/2004 | Maeda | |
| 2005/0076942 A1 | | 4/2005 | Hirst et al. | |
| 2005/0084276 A1 | | 4/2005 | Hirst et al. | |

FOREIGN PATENT DOCUMENTS

| | | |
|---|---|---|
| CN | 1779599 A | 5/2006 |
| DE | 10 2004 028 982 A1 | 5/2005 |
| DE | 10 2004 028 983 A1 | 5/2005 |
| DE | 10 2004 029 083 A1 | 5/2005 |
| JP | H06-178446 A | 6/1994 |
| JP | 2001075681 A | 3/2001 |
| JP | 2001-282396 A | 10/2001 |

* cited by examiner

*Primary Examiner* — Luan V Van
(74) *Attorney, Agent, or Firm* — Tim Tingkang Xia; Morris, Manning & Martin, LLP

(57) ABSTRACT

A computer with thermoelectric conversion uses a thermoelectric conversion module that connects between a heat generating device and a low temperature device to fully utilize the redundant heat generated by the computer. The thermoelectric conversion module converts heat to power based on a temperature difference between the heat generating device and the low temperature device. The power generated by the thermoelectric conversion module is then delivered to a load that can be activated by the power.

18 Claims, 4 Drawing Sheets

COMPUTER WITH THERMOELECTRIC CONVERSION

BACKGROUND OF THE INVENTION

1. Field of the Invention

The present invention relates to a computer, and more specifically, to a computer with thermoelectric conversion.

2. Description of the Prior Art

A prior art computer commonly utilizes a cooling apparatus to reduce high temperature caused by heat generated by internal electronic elements, such as a CPU. There is no effective utilization of the redundant heat generated by these electronic elements. Additionally, research and development of computer power related subjects is mainly focused on enhancing capacity or efficiency of rechargeable batteries of portable computers. Few improvements have been made for reusing the heat generated in the operation of portable computers.

SUMMARY OF THE INVENTION

Therefore, the primary objective of the claimed invention is to provide a computer system with thermoelectric conversion to solve the above problem.

The claimed invention provides a computer with thermoelectric conversion comprising a heat generating device, a low temperature device, a thermoelectric conversion module coupled with the heat generating device and the low temperature device for generating power according to a temperature difference between the heat generating device and the low temperature device, and a load for receiving the power generated by the thermoelectric conversion module.

The claimed invention also provides a computer with thermoelectric conversion comprising an electronic element having a thermal conductor installed on a surface of the electronic element, a low temperature conductor, a thermoelectric conversion module coupled with the thermal conductor and the low temperature conductor for generating power according to a temperature difference between the thermal conductor and the low temperature conductor, and a first cooling fan coupled to the thermoelectric conversion module for receiving power from the thermoelectric conversion module for cooling the electronic element.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
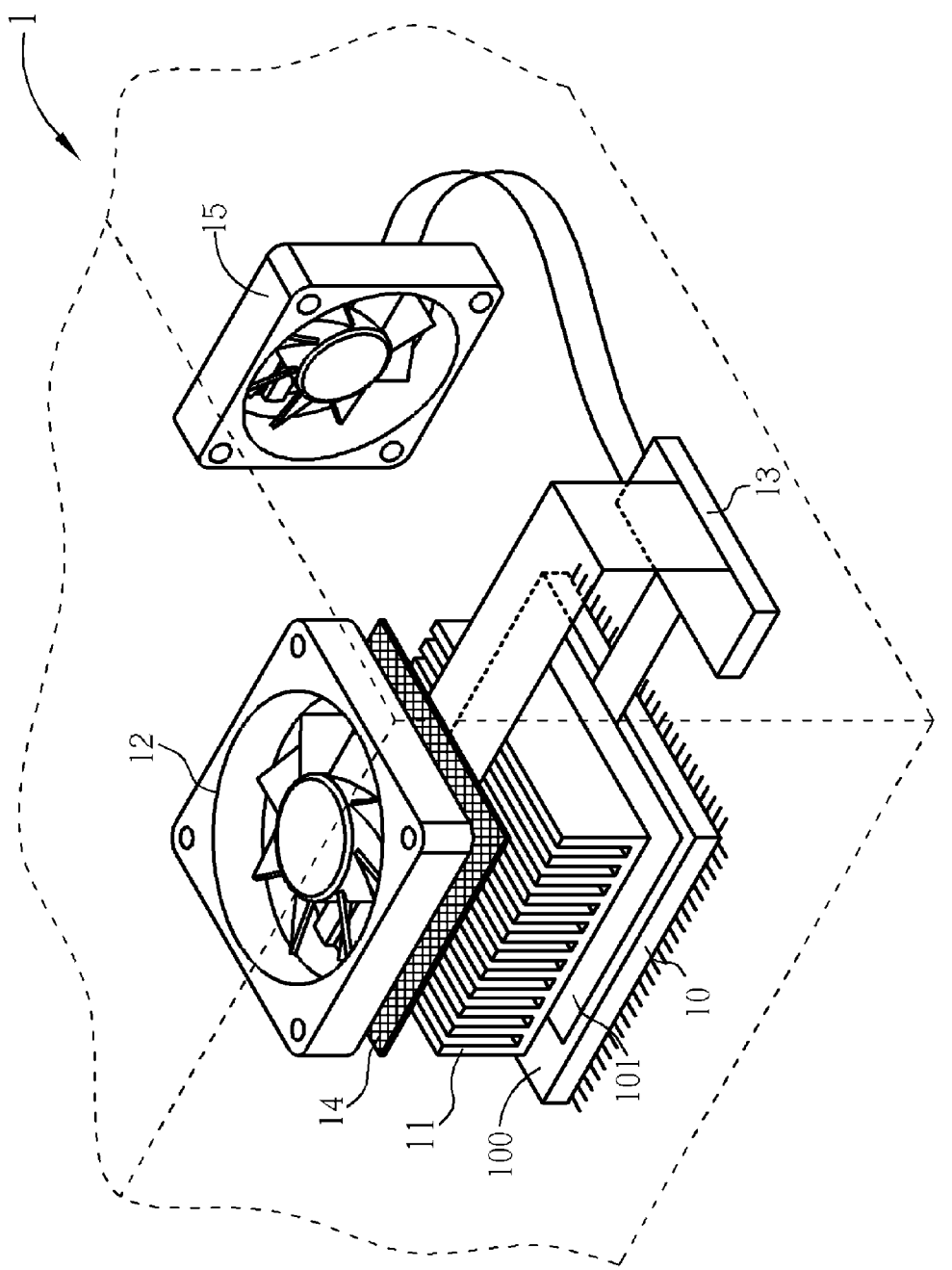
FIG. 1 illustrates a first preferred exemplary embodiment of a present invention computer with thermoelectric conversion.

Before the present invention is disclosed in detail, please note that similar elements are identified by the same reference numeral.

Please refer to FIG. 1 for a first preferred exemplary embodiment of a present invention computer 1 with thermoelectric conversion. The computer 1 of the present invention (such as a desktop computer, a microcomputer, a terminal, a portable computer, or a server) comprises a CPU 10 (as a heat generating device, and this can include other elements such as memory or a chip), a heat sink 11, a first cooling fan 12, a thermoelectric conversion module 13, a low temperature device 14 (as a low temperature source, this can be other elements that provide a low temperature source, such as a chassis or a low temperature conductor), and a second cooling fan 15 (as a load). No further description will be made about the heat sink 11 installed above the CPU 10, and the first cooling fan 12 installed above the heat sink 11 since these are well-known prior art elements.

The CPU 10 has a surface 100, and a thermal conductor 101 is installed on the surface 100. The thermal conductor 101 can be made of copper, aluminum, or other material that has a high heat transfer coefficient.

The low temperature device 14 is meshed and made of copper, aluminum, or other material having a high heat transfer coefficient, and is located between the heat sink 11 and the first cooling fan 12. The low temperature device 14 has a lower temperature relative to the thermal conductor 101 since the first cooling fan 12 blows air away from the low temperature device 14.

The thermoelectric conversion module 13 is composed of a P-type semiconductor and an N-type semiconductor, which connects to the thermal conductor 101 with one end and to the low temperature device 14 with the other end. When a temperature difference exists between both ends of the thermoelectric conversion module 13, the carrier density of the high temperature zone is higher than that of the low temperature zone, causing carriers to diffuse from the high temperature zone to the low temperature zone. The uneven distribution of the carriers will make an electromotive force and produce a current via a phenomenon called the Seeback Effect. With the Seeback Effect, the thermoelectric conversion module 13 can convert heat into power according to the thermoelectric conversion principle.

The second cooling fan 15 (the load) is connected to the thermoelectric conversion module 13 with two conducting wires, and can be activated by the power generated by the thermoelectric conversion module 13. The heat generated by the operation of the CPU 10 is conducted from the surface 100 to the thermal conductor 101. The thermoelectric conversion module 13 can then generate power from the heat due to the temperature difference. The power generated by the thermoelectric conversion module 13 can provide the second cooling fan 15 with a current and drive the second cooling fan 15 to cool the CPU 10.

Figure 2:
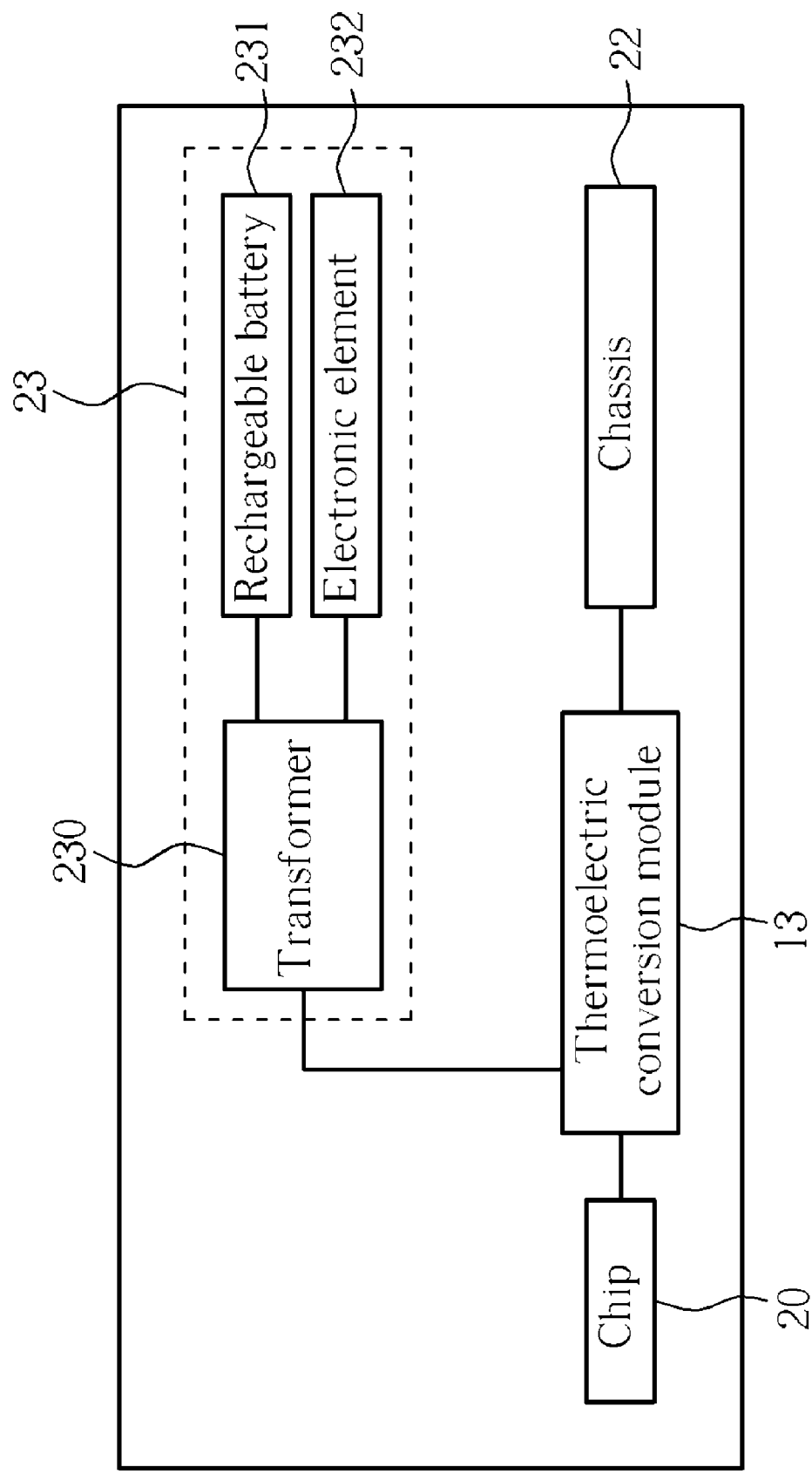
FIG. 2 illustrates a block diagram of a second preferred exemplary embodiment of a present invention computer with thermoelectric conversion.

Please refer to FIG. 2 for a second preferred exemplary embodiment of a present invention computer 1 with thermoelectric conversion. Different from the first preferred exemplary embodiment of the present invention, the second preferred exemplary embodiment comprises a chip 20 as the heat generating device, a chassis 22 as the low temperature device, a load 23 having a transformer 230 and a rechargeable battery 231, and an electronic element 232 connected to the transformer 230.

The heat-producing chip 20 transmits heat to the thermoelectric conversion module 13, which then converts the heat to power based on the temperature difference formed by the chip 20 and the chassis 22 and transmits the power to the transformer 230. The transformer 230 transforms the power into electric voltage that charges the rechargeable battery 231 and powers the electronic element 232.

Figure 3:
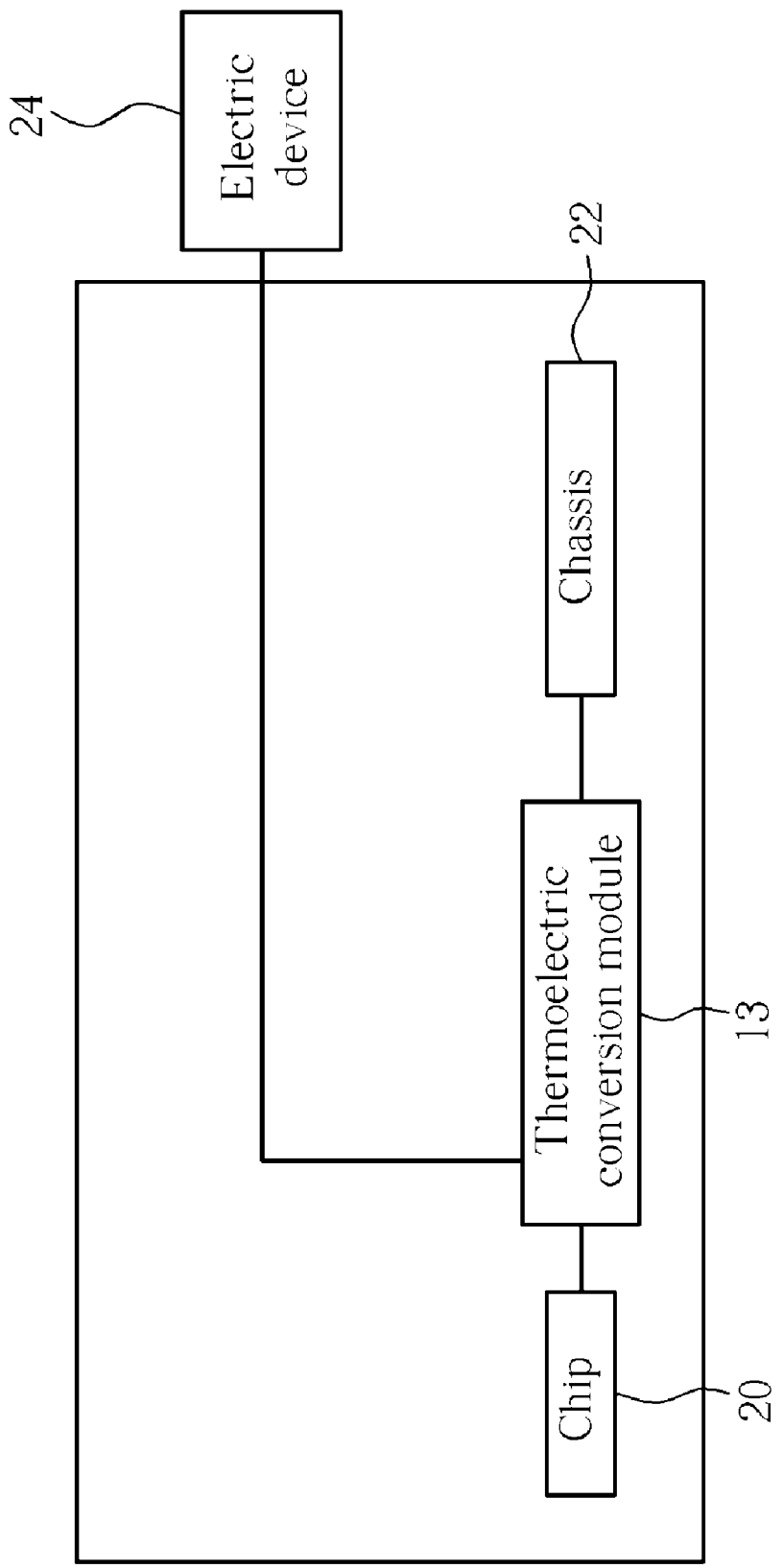
FIG. 3 illustrates a block diagram of a third preferred exemplary embodiment of a present invention computer with thermoelectric conversion.

FIG. 3 shows a third preferred exemplary embodiment of a present invention computer 1 with thermoelectric conversion. Different from the second preferred exemplary embodiment, the output of the thermoelectric conversion module 13 connects to an electric device 24 (such as a screen or an indicating light which are not shown in the figure). When a notebook computer, for example, plays music with its screen shutdown, the thermoelectric conversion module 13 supplies power to a small indicating screen or an indicating light for displaying status of playback. In a music-playing mode with the notebook computer's primary functions shutdown, a decoder chip can be taken as the heat generating device.

Figure 4:
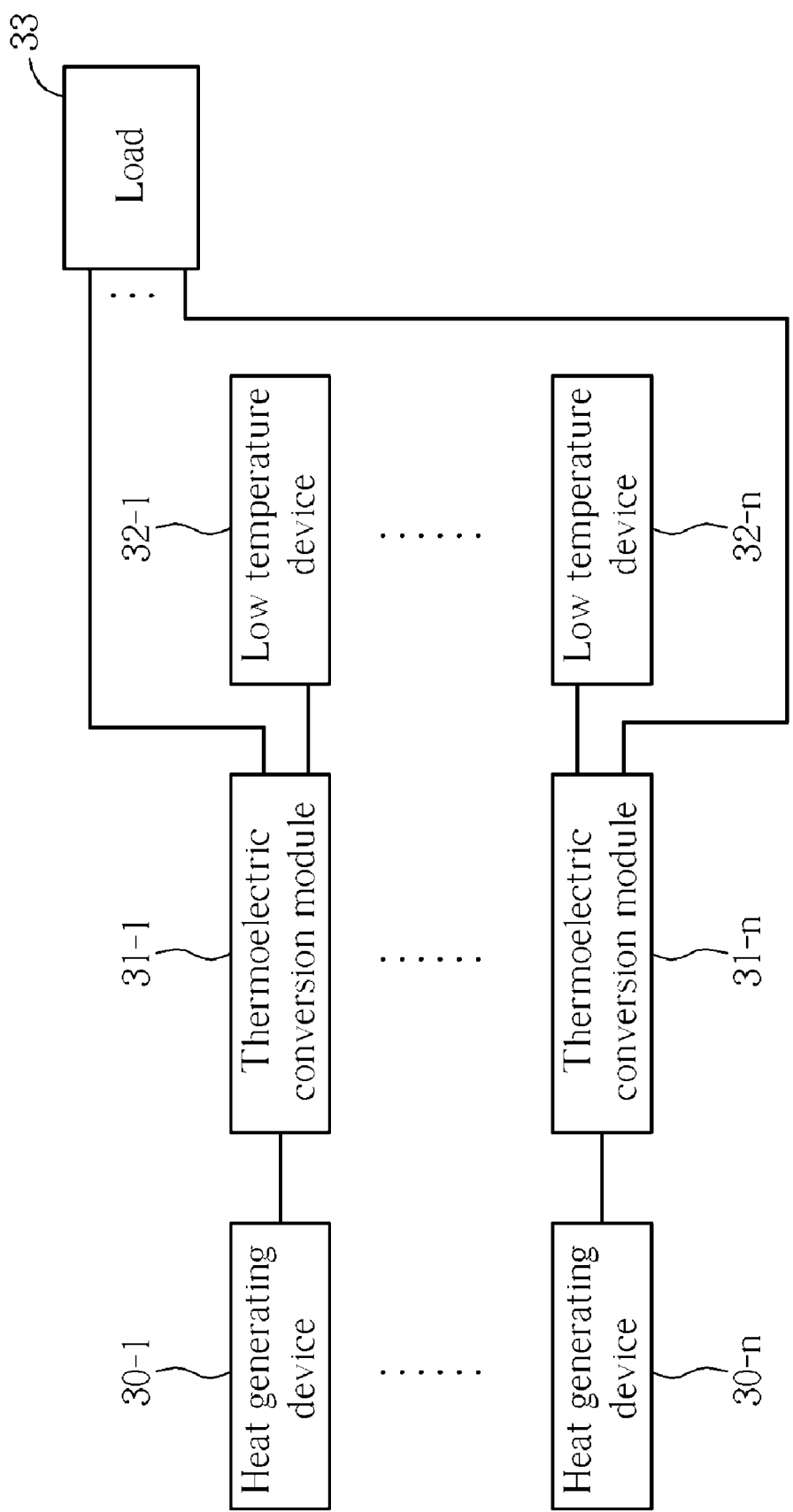
FIG. 4 illustrates a block diagram of a fourth preferred exemplary embodiment of a present invention computer with thermoelectric conversion.

Please refer to FIG. 4 for a fourth preferred exemplary embodiment of the present invention computer 1 with thermoelectric conversion. A plurality of parallel thermoelectric conversion modules 31-1 to 31-$n$ is introduced in the fourth preferred exemplary embodiment. Each thermoelectric conversion module 31-1 to 31-$n$ is respectively coupled between a corresponding heat generating device 30-1 to 30-$n$ (such as a CPU, memory, or any other chip inside a computer, which are not shown in the figure) and one of a plurality of low temperature devices 32-1 to 32-$n$ (such as a low temperature conductor or a chassis). Each thermoelectric conversion module 31-1 to 31-$n$ can convert heat into power based on a temperature difference between the heat generating device and the low temperature device. The load 33 (such a cooling fan, a thermoelectric cooler, a transformer, or an electric device, which are not shown in the figure) is coupled to the plurality of the thermoelectric conversion modules 31-1 to 31-$n$ for receiving the sum of the power from the plurality of the thermoelectric conversion modules 31-1 to 31-$n$.

The present invention computer with thermoelectric conversion can fully utilize heat generated during the operation of the computer by converting the heat into power that can be used to dissipate heat from the computer itself and lower the computer's working temperature. The power generated by the thermoelectric conversion module of the computer can further provide an auxiliary power source to charge the rechargeable battery of the computer, increasing the available use time. Similarly, the power can even be delivered to other electronic devices making the most of the total energy supplied to the computer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thermoelectric conversion device comprising:
    a heat generating device;
    a low temperature device formed in a meshed structure, and the low temperature device being disposed above the heat generating device;
    a heat-dissipating device installed between the heat generating device and the low temperature device for dissipating heat from the heat generating device, and the heat generating device, the heat-dissipating device, and the low temperature device being stacked in a vertical alignment;
    a first cooling fan together with the heat-dissipating device to sandwich the low temperature device therebetween and the first cooling fan blowing air to the heat-dissipating device through the low temperature device;
    a thermoelectric conversion module coupled with the heat generating device and the low temperature device via two thermal connecting elements for generating power according to a temperature difference between the heat generating device and the low temperature device, the thermoelectric conversion module being not in physical contact with a top surface of the heat generating device; and
    a load for receiving the power generated by the thermoelectric conversion module.

2. The thermoelectric conversion device of claim 1 wherein the heat generating device is an electronic element.

3. The thermoelectric conversion device of claim 2 wherein the electronic element is a CPU, memory, or a chip.

4. The thermoelectric conversion device of claim 2 wherein the electronic element includes a thermal conductor connected with the thermoelectric conversion module.

5. The thermoelectric conversion device of claim 1 wherein the low temperature device is a chassis, or a low temperature conductor.

6. The thermoelectric conversion device of claim 1 wherein the load is a second cooling fan.

7. The thermoelectric conversion device of claim 1 wherein the load is a thermoelectric cooler.

8. The thermoelectric conversion device of claim 1 wherein the load comprises:
    a transformer for transforming power received from the thermoelectric conversion module; and
    a rechargeable battery for receiving power from the transformer.

9. The thermoelectric conversion device of claim 8 further comprising an electronic element for receiving power from the transformer.

10. The thermoelectric conversion device of claim 1 wherein the load comprises:
    a transformer for transforming power received from the thermoelectric conversion module; and
    an electronic element for receiving power from the transformer.

11. The thermoelectric conversion device of claim 1 wherein the load is an electric device.

12. The thermoelectric conversion device of claim 11 wherein the electric device is an indicating screen, or an indicating light.

13. The thermoelectric conversion device of claim 1 wherein the thermoelectric conversion device is a desktop computer, a microcomputer, a terminal, a portable computer, or a server.

14. The thermoelectric conversion device of claim 1 wherein the heat-dissipating device is a heat sink.

15. A thermoelectric conversion device comprising:
    an electronic element having a thermal conductor installed on a surface of the electronic element;
    a low temperature conductor formed in a mesh structure, and the low temperature device being disposed above the electric element;
    a heat-dissipating device installed between the electric element and the low temperature conductor for dissipating heat generated by the electronic element, and the thermal conductor, the heat-dissipating device and the low temperature device being stacked in a vertical alignment;
    a first cooling fan together with the heat-dissipating device to sandwich the low temperature device therebetween and the first cooling fan blowing air to the heat-dissipating device through the low temperature device;
    a thermoelectric conversion module coupled with the thermal conductor and the low temperature conductor via two thermal connecting elements for generating power according to a temperature difference between the thermal conductor and the low temperature conductor, the thermoelectric conversion module being adjacent to the electronic element; and a second cooling fan coupled to the thermoelectric conversion module for receiving power from the thermoelectric conversion module for cooling the electronic element.

16. The thermoelectric conversion device of claim 15 wherein the electronic element is a CPU.

17. The thermoelectric conversion device of claim 15 wherein the thermoelectric conversion device is a desktop computer, a microcomputer, a terminal, a portable computer, or a server.

18. The thermoelectric conversion device of claim 15 wherein the heat-dissipating device is a heat sink.

* * * * *